United States Patent [19]

Habeger, Jr. et al.

[11] 4,117,473
[45] Sep. 26, 1978

[54] DISPLAY SYSTEM FOR DISPLAYING INFORMATION IN THE FORM OF A HORIZONTALLY ORIENTED CURVE ON A RASTER TYPE CRT

[75] Inventors: Charles C. Habeger, Jr.; Michael J. Irwin, both of Bartlesville, Okla.

[73] Assignee: Phillips Petroleum Company, Bartlesville, Okla.

[21] Appl. No.: 762,353

[22] Filed: Jan. 25, 1977

[51] Int. Cl.$^2$ ............................................... G06F 3/14
[52] U.S. Cl. ............................... 340/324 AD; 364/855
[58] Field of Search .................... 340/324 A, 324 AD; 364/855

[56] References Cited

U.S. PATENT DOCUMENTS

| 3,406,387 | 10/1968 | Werme | 340/324 AD |
| 3,603,963 | 9/1971 | Ward | 340/324 A |
| 3,686,662 | 8/1972 | Blixt et al. | 340/324 AD |
| 3,781,850 | 12/1973 | Gicca et al. | 340/324 AD |
| 3,792,464 | 2/1974 | Hamada et al. | 340/324 AD |

Primary Examiner—Marshall M. Curtis

[57] ABSTRACT

A horizontally oriented curve is produced on a raster type cathode ray tube display by storing curve data words in a memory and placing a series of dots on the cathode ray tube screen with each dot being at a height dictated by the value of the respective data word and at a horizontal position dependent on the order in which the respective data word is received. A dot counter provides an output signal for writing the curve data words into the address locations of the memory in the order in which the curve data words are received. A horizontal raster position counter provides a read address signal to the memory for each possible dot position in a horizontal scan. A comparator circuit compares each curve data word read out of the memory with a signal representative of the vertical position of the current horizontal scan and produces a video enable signal to produce a dot on the cathode ray tube screen when the compared signals are equal. Means can be provided to fill in vertical gaps when there is one or more horizontal scans between vertically adjacent curve data points.

22 Claims, 3 Drawing Figures

DISPLAY SYSTEM FOR DISPLAYING INFORMATION IN THE FORM OF A HORIZONTALLY ORIENTED CURVE ON A RASTER TYPE CRT

This invention relates to method and apparatus for displaying information on a cathode ray tube (CRT). In a specific aspect, the invention relates to method and apparatus for displaying one or more horizontally oriented curves on a raster type CRT. In another aspect the invention relates to method and apparatus for simultaneously displaying alphanumeric information and one or more horizontally oriented curves on a raster type CRT. In a further aspect the invention relates to method and apparatus for filling in gaps between data points on a curve on a raster type CRT.

In comparison with other display systems, raster type CRT's have a number of very important advantages. These include: low cost; rapid update; flicker free display of large amounts of data; and good character quality. One of the greatest disadvantages of raster CRT's is their inability to display high quality graphics. Raster CRT's realize graphic representations simply by adding a set of non-alphanumeric characters to the CRT's vocabulary. Since it is feasible to have only a small number of such characters and since only one character can be placed in each character dot matrix, raster CRT graphics are very rough. If one wished to display variable data in the form of a curve, he would be forced to program a computer to take the curve coordinates and choose an appropriate series of graphics characters. However, in spite of this considerable effort, the limited graphics set would still produce a poor quality curve.

It is known that a CRT can be employed in an oscilloscope to display a horizontally oriented curve, e.g., a sine wave having a horizontal time axis or an electrocardiogram having a horizontal time axis. In such instances the constant intensity electron beam is driven across the CRT screen by the vertical and horizontal voltages in conformance to the curve configuration. However, where a raster type CRT is employed to provide alphanumeric information and/or pictorial information, the electron beam must follow the raster pattern and cannot follow the curve configuration. If the curve has a vertical time axis, there is only one data point per horizontal raster scan and this curve data point information can be readily added to the other video information. However, where the curve has a horizontal time axis, there can be a plurality of curve data points on any horizontal raster scan.

The present invention provides a unique method and apparatus for producing single dot resolution curves having horizontal orientation on a raster CRT. The resulting curves are of a high quality and require only a small amount of software control.

The special graphics logic receives data from the computer in the form of eight bit data words. The data words are stored in a memory and the logic places a dot on the screen at a height dictated by the size of each eight bit word and at a horizontal position dependent on the order in which the data was received by the CRT. If an all "1"s is detected, no dot is displayed on the screen at the corresponding horizontal location. To avoid a dotty looking curve, the logic has the ability to fill in the vertical gaps between the data point dots. The curves can extend the width of the screen and the full or any part of the height. The video for the curves is "or"ed with the normal video so that alphanumeric and normal graphic data can be written over the curves. The color of each curve is selectable and each curve can be placed on the screen independent of the location of other curves.

In this mode the first piece of data is displayed on the right edge of the screen and shifted left as new data arrives.

If curve data is to be sent to the CRT monitor 13, a three word header, containing an invalid line address must be sent. D4 through D8 of word 2 are normally used to designate the line address (0 to 23) of the character data. When D4 and D5 are high, the address is over 23 and the CRT logic control circuits interpret the following data as curve information. To return to normal character operation, one must simply send a header with a line address less than 24. The remaining bits in the header message are used to designate curve characteristics and the following data words denote curve points.

In the drawings

Figure 1:
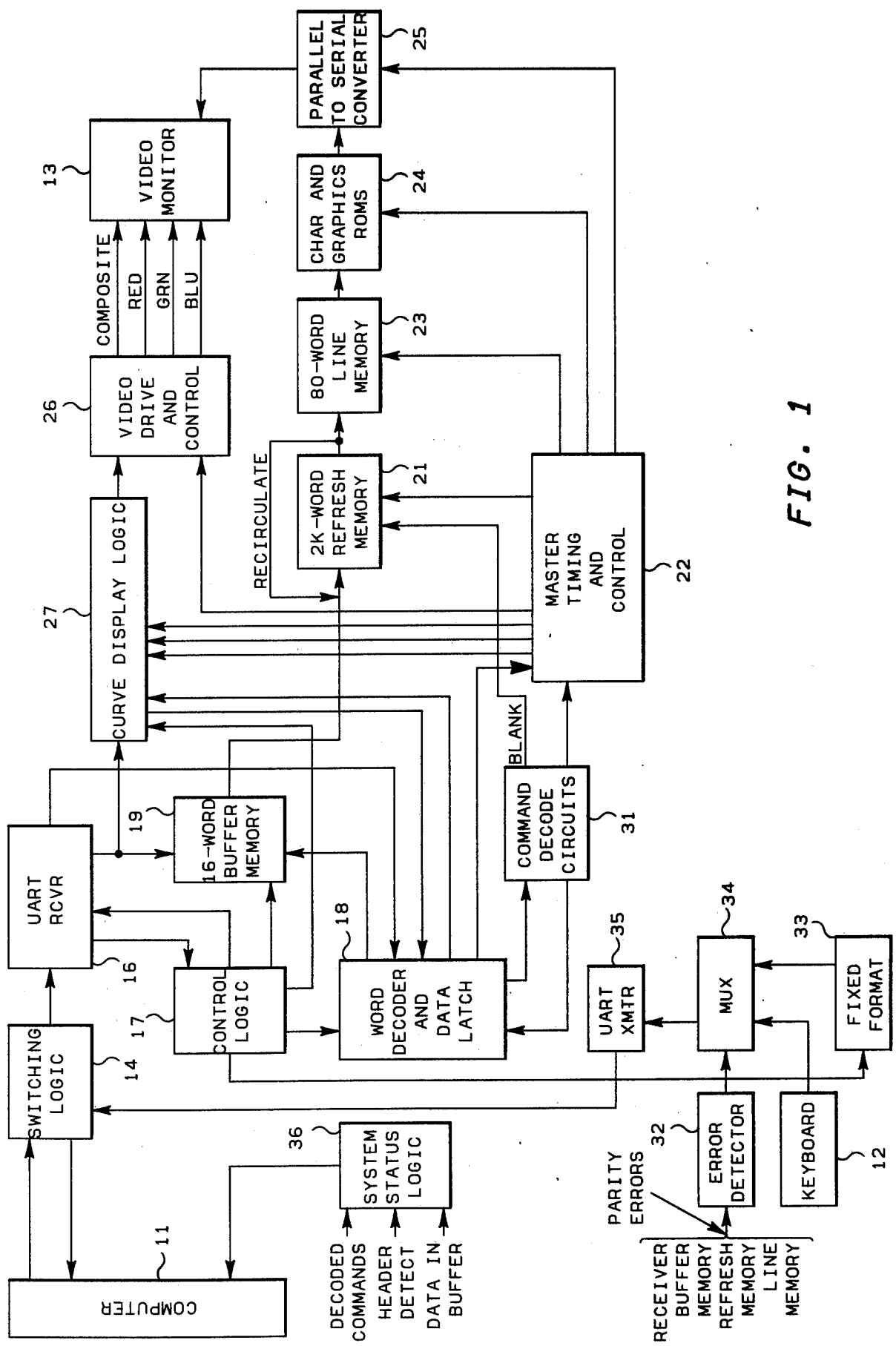
FIG. 1 is a block diagram illustrating functional data flow in a CRT-computer system embodying the present invention.
Figure 2:
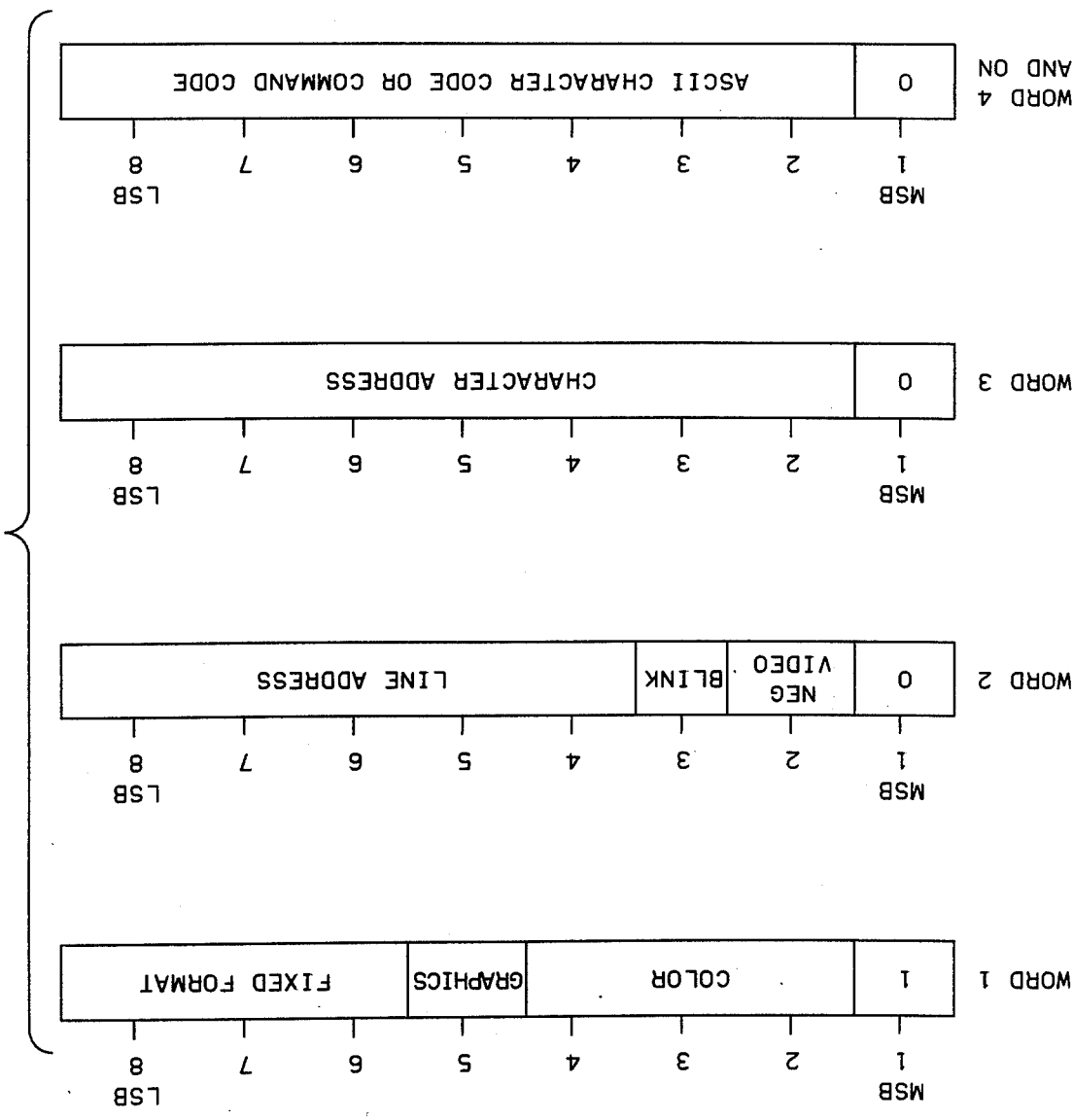
FIG. 2 is a diagrammatic representation of data words in a message from the computer to the CRT terminal.

The invention will be described in terms of a specific embodiment of a CRT terminal for a computer system represented by FIG. 1. The CRT terminal is a serial-communication computer peripherial device which provides rapid interaction in monitoring and controlling a computer-managed system. Control messages can be entered into the computer 11 via a keyboard 12. When addressed by a keyboard input, the computer 11 in turn updates the data displayed on the video monitor 13 and/or performs a software controlled function. The CRT terminal includes either a monochrome or a color video monitor 13, CRT logic control circuits, and a keyboard 12. The CRT logic control circuits constitute the interface between the video monitor 13 and the system computer 11. The CRT logic control circuits provide the video monitor with the video (color if applicable) and sync signals necessary to display data formulated by the computer 11. Messages are transmitted between the CRT terminal and the computer 11 in a full-duplex serial mode at selectable baud rates. The different baud rates permit rapid data exchange between the CRT terminal and computer at rates from 27.3 to 872.7 words per second. Transmission is asynchronous with the lowest order bit transmitted first. Each word consists of an eleven-bit character code containing eight data bits, a parity bit to maintain odd parity, one start bit, and one stop bit. Each character word or string of characters sent to the CRT terminal is prefixed by a three-word header message with words 1, 2 and 3 following in order. After the three header words are transmitted, any number of character codes may be sent and displayed to the right of the last character received. When the 81st character of a line is sent, the line address is automatically incremented and the character address reset to zero. Thus the 81st character is displayed in the next line down in character position zero. When the last (24th) line is overrun, the data will be displayed in line zero. The bit significance of each computer-to-CRT terminal message is illustrated in FIG. 2. Bit D1 is used as an identifier tag to designate word 1. It is always set to a "1" in word 1 and to a "0" otherwise. Bits D2 through D4 in word 1 specify the color in which the alphanumeric, or graphic character contained in word 4 (and subsequent words if applicable) will be displayed. In word 2, bit D1 must be "0". A "0" in data bit D2 selects positive (normal) video and a "1" selects negative video. The character contained in word 4, and succeeding words, will blink when displayed on the video monitor screen if data bit D3 in word 2 is set to a "1". Bits D4 through D8 in word 2 contain the binary line address of the character to be displayed. Valid line addresses range from zero (00000) to 23 (10111). If the line address is 11000 or greater, all information is directed at the curve display logic units until a valid line address is received. In word 3, bit D1 must be a "0". Bits D2 through D8 in word 3 contain the binary character address of the character to be displayed. Valid character addresses range from zero (0000000) to 79 (1001111). Word 3 is also used to set up the curve provided by curve display logic circuits when preceded by an invalid line address. The fourth word may be either a character or a command word in a suitable code, e.g., the American Standard Code for Information Interchange (ASCII). Bit D1 of word 4 must be a "0". The CRT logic control circuits inspect bits D2 and D3. If D2 and D3 of word 4 are equal, bits D4 through D8 are decoded as a command that is immediately executed. Command words are not displayed on the video monitor screen. If data bits D2 and D3 of word 4 are not equal, the data is interpreted as alphanumeric, or graphic data (depending on bit D5 of word 1). In this case, the character is stored in refresh memory 21 and displayed on the screen 13. When in the special graphics mode provided by the curve display logic circuits 27, words 4 and thereafter are used to designate the vertical height of the curve dots.

Serial data in eleven bit form is transmitted from computer 11 to computer/fixed format input switching logic 14 via data transfer line 15, and is then routed to a universal asynchronous receiver/transmitter (UART) 16 operated as a receiver. The receiver 16 converts the eleven bit form serial data message into parallel eight-bit words. Following receipt and conversion of the serial data word from the computer 11 to an eight-bit parallel data word, the receiver 16 stores the parallel data word in its receiver holding register and notifies control logic 17. In the absence of inhibiting signals, control logic 17 actuates word decoder and data latch 18 to decode the three-word header message and to latch in the contents of the three color bits (D2, D3 and D4) and the alpha/graphics bit (D5) of word 1, and the negative video bit D2 and blank bit D3 of word 2. The line address bits D4-D8 of word 2 and the character address bits D2-D8 of word 3 are strobed from word decoder and data latch 18 into line address and character address counters in master timing and control 22. Control logic circuit 17 decodes each parallel data word output from receiver 16 and transfers the data to a 16-word random access buffer memory 19. Buffer memory 19 is used for temporary storage of the data. The buffer memory 19 consists of read/write memories, a write address counter, a multiplexer, a parity checker and associated controls. Data is stored in one of 16 locations in the buffer memory 19 and read out when a match occurs on the line and character address registers in master timing and control circuitry 22. The absolute position of data in buffer memory 19 is unimportant since a counter is provided for both the read address and for the write address. The data is then shifted from buffer memory 19 into a 2048-word refresh memory 21 at the proper time by a command to refresh memory 21 from master timing and control circuits 22. This command is generated by the master timing circuit of 22 when the master timing circuit determines that the shift registers of refresh memory 21 have been clocked to the address contained in the header message of the data in buffer memory 19.

The refresh memory 21 consists of up to twenty-six 1024-bit shift registers. Eight of the twenty-six shift registers are associated with the color and alpha/graphics features. The refresh memory 21 uses two of the 1024-bit shift registers (2048 bits total) for each of the thirteen temporary data storage inputs. Since there are only 1920 characters in a full screen display, an extra 128 clock pulses are required to circulate the refresh memory. This is accomplished during system blanking. Refresh memory data is recirculated, or refreshed, on the 10th scan (10 CRT raster scans per line of data). If no data is transmitted from buffer memory 19 at this time, the existing data will be recirculated. The master timing circuit of master timing and control 22 also determines when to shift a line of data from refresh memory into an eighty-word line memory 23. The line memory 23 is loaded on the tenth scan before the CRT raster changes lines. The line memory 23 consists of four quad 80-bit static shift registers. The line memory 23 holds eighty characters (one line) with provisions for ten scans to each character. The line memory 23 recirculates a line of data during each scan, thus presenting the same information for each character position ten times. This is necessary for correct presentation of the character by the dot matrix generator. Data in the memory 23 is shifted out during the tenth scan as data from the refresh memory 21 is shifted in. Otherwise the data is simply recirculated during the first nine scans. The scan address and the output of line memory 23 provide the address for the alphanumeric and graphic character read-only memories (ROM) 24. An alphanumeric or graphic ROM is enabled via the word decoder circuit of word decoder and data latch 18. The ROM's 24 provide the character display pattern for each of the ten line scans. The outputs of ROM's 24 are converted from parallel data to serial data signals in converter 25 and then applied to the video drive and control circuits 26. Video drive and control circuits 26 produces the green and black or color video signals which are combined with the special graphics video signals from curve display logic circuits 27 by an appropriate number of AND gates, and the combined signals are applied to the video monitor 13.

When one of the data words following the three-word header message contains a command code, word decoder and data latch 18 transmits a signal to command decode circuits 31 and the character code thus interpreted as a command function is not stored in refresh memory 21.

A summary of the routing and timing of the eight-bit serial data (D bits) output from receiver 16 is provided below.

Word 1 — The contents of D2, D3, D4 (color) and D5 (alpha/graphics) are stored in latch 18 concurrent with decode "6" and DATA STROBE signals. D6, D7, and D8 (fixed format) are routed to fixed format circuits 33. If these bits contain a fixed format select code, data to or from the computer is inhibited.

Word 2 — The contents of D2 (negative video) and D3 (blink) are stored in latch 18 concurrent with decode "7" and DATA STROBE signals. The line address contained in bits D4 through D8 is routed to master timing and control 22 and latched into the line address counters therein concurrent with the LINE ADDRESS STROBE (DECODE 7 and DATA STROBE).

Word 3 — The character address contained in bits D2 through D8 is applied to master timing and control 22 and latched into the character address counters therein concurrent with the CHARACTER ADDRESS STROBE (decode "8" and DATA STROBE).

Word 4 — Bits D2, D3, and D4 determine if the word is a command decode (D2 = D3 and D4 low) or a character code. A COLOR STROBE is generated if D4 is high and D2 and D3 are alike. Character code data bits D3 through D8 are applied directly to the buffer memory. Decode 9, indicating a data word, and DATA STROBE are applied to the write/read and address control logic of buffer memory 19.

Color, alpha/graphics, negative video, and blink codes are applied to the buffer memory 19 from latch 18. These codes, together with the character code, are applied to a parity generator in word decoder and data latch circuit 18. The parity bit goes high if an even number of inputs are high. This parity bit is also applied to the buffer memory 19. The serial data from the receiver 16 must be stored in the buffer memory 19 until the appropriate time to read it into the shift register of refresh memory 21 is reached.

In addition to providing the control timing for refresh memory 21, line memory 23, ROM's 24 and converter 25, the master timing circuitry of the master timing and control circuit 22 generates the sync pattern required by the video drive circuitry 26 to produce the composite sync for the video monitor. Signals such as CURSOR, BLINK, and NEG VIEO are added to the video signal before it is applied to the video monitor 13.

Special command codes from the computer 11, such as CURSOR LEFT and BLANK SCREEN, are detected by word decoder and data latch 18 and routed to command decode circuits 31. The command decode circuitry decodes these commands and initiates the required function. It also generates a signal to inhibit the command code from being loaded into refresh memory thus preventing the display of an erroneous character on the video monitor screen 13.

Three error checks are made when data is shifted into the receiver 16: (1) parity, (2) overrun, and (3) framing. Data is also checked for odd parity at the buffer memory 19, refresh memory 21, and line memory 23 outputs. These error codes are decoded by error decoder 32. The output of decoder 32, the output of fixed format 33 and the keyboard data are applied to a data select multiplexer 34 for computation of data priority. The selected data is applied to a UART transmitter 35 for conversion from parallel to serial data. The serial data is then forwarded to the switching network 14. Keyboard data and error codes are routed to a computer by the switching logic 14. Fixed format data is applied to the UART receiver 16 and processed as incoming data to be displayed on the video monitor screen 13. The system status logic circuitry 36 monitors various system functions and generates the signal to either inhibit or enable data transmission by the computer 11.

The CRT monitor 13 sweeps in a continuous line from left to right across the face of the screen, with 10 scans (0 to 9) for each alphanumeric or graphic line. This is the reason the line memory 23 recirculates each line of data 10 times. During each scan for any given line, memory bits representing different parts of the dot matrix for each alphanumeric or graphic character in the line are turned on by the character and graphics ROM's 24.

Figure 3:
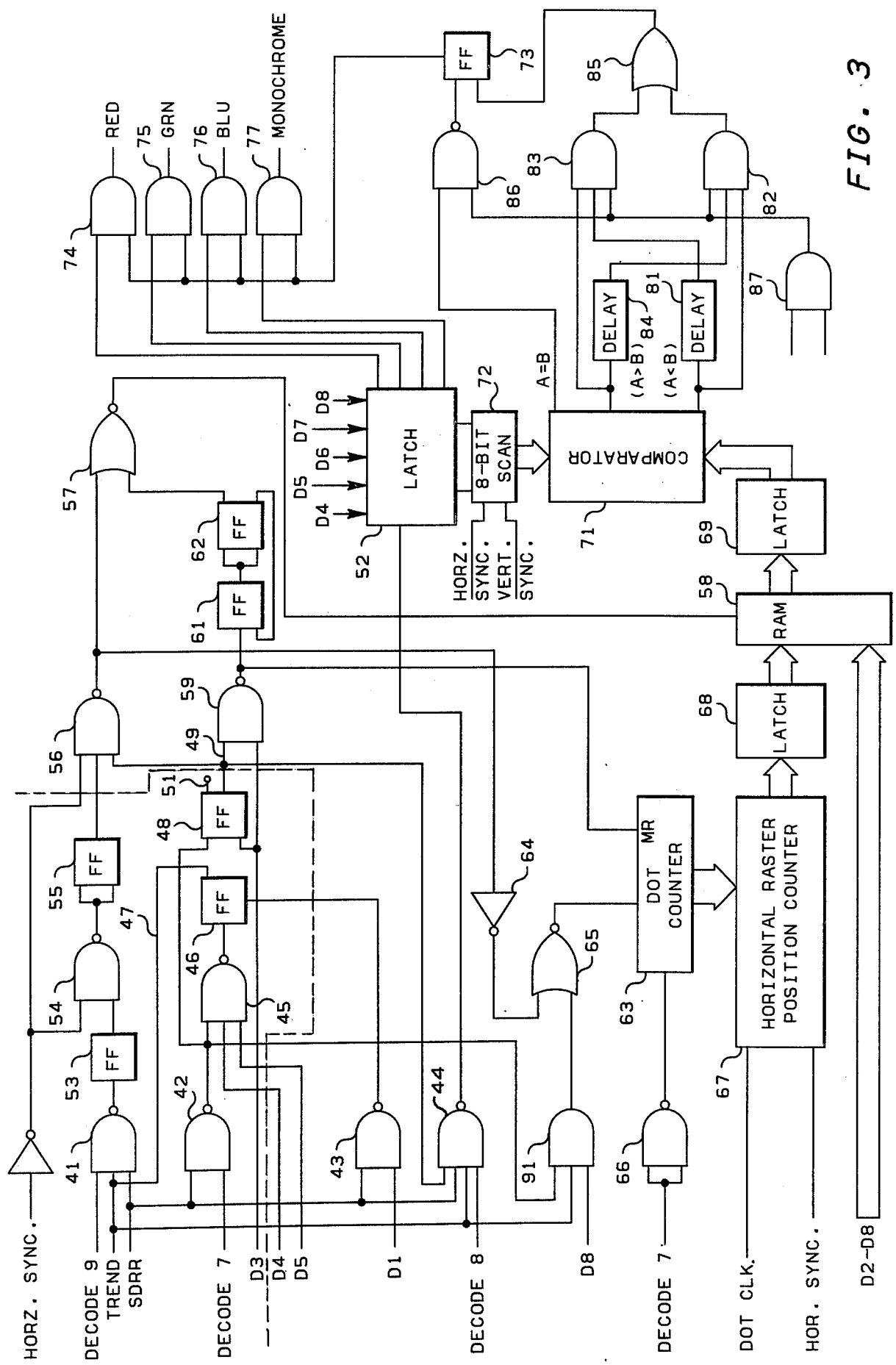
FIG. 3 is a schematic representation of the curve display logic circuits of FIG. 1.

The curve display logic circuits 27 contain the circuitry for the special graphics mode. It has the capability to simultaneously display two curves having a horizontal axis. The circuitry for one curve is shown in FIG. 3, the circuitry for the other curve being identical thereto.

The special graphics mode provides the capability of drawing two dot addressable, horizontal curves across the screen 13. Curve display logic circuits 27 receive curve data from the computer 11 in the form of seven bit data words. The data words are stored in a memory and the logic places a dot on the screen 13 at a height dictated by the binary value of each seven bit word and a horizontal position dependent on the order in which the data was received by the monitor 13. The first data word places a dot at the left edge of the screen 13 and each following dot is progressively one position to the right. If an all "1"s is detected, no dot is displayed on the screen at the corresponding horizontal location. To avoid a dotty looking curve, the curve display logic circuits 27 have the ability to fill in the vertical gaps between the dots. The curves extend the width of the screen and half the height. The video for the curves is "OR"ed with the normal video so that alpha-numeric and limited graphics characters can be written over the curves. The color of each curve is selectable and each curve can be placed in the top, middle, or bottom of the screen independent of the other curve's location.

After the full curve (640 WORDS) has been sent, the curve automatically goes into a scroll type operation. The next piece of data is placed at the far right of the screen, the rest of the curve shifts left, and the first word of data is lost from the display. If desired, the curve may be originated in scroll operation by sending the proper header. In this mode the first piece of data is displayed on the right edge of the screen and shifted left as new data arrives.

If curve data is to be sent to the CRT monitor 13, a three word header, containing an invalid line address must be sent. D4 through D8 of word 2 are normally used to designate the line address (0 to 23) of the character data. When D4 and D5 are high, the address is over 23 and the CRT logic control circuits interpret the following data as curve information. To return to normal character operation, one must simply send a new header with a line address less than 24. The remaining bits in the header message are used to designate curve characteristics and the following data words denote curve points.

The following table defines the format for special graphics operation.

TABLE I

| | Special Graphics Format | | | | | | | |
|---|---|---|---|---|---|---|---|---|
| | D1 | D2 | D3 | D4 | D5 | D6 | D7 | D8 |
| Word 1 | 1 | X | X | X | X | 0 | 0 | 0 |
| Word 2 | 0 | X | CV | 1 | 1 | X | S2 | S1 |
| Word 3 | 0 | C | MR | R | G | B | L1 | L2 |
| Word 4 and on | 0 | D0 | D1 | D2 | D3 | D4 | D5 | D6 |

The X's in the table indicate that these bits are not used in special graphics circuitry. The CV bit is used to designate one of the two available curves (high for curve 2 or low for curve 1). The MR bit is employed to designate whether the curve will be erased or the following data words will be added to the right side of the curve. If the MR bit is low the data is added on the right side of the addressed curve. After the full curve (640 words) has been transmitted to the CRT, the curve is shifted left one dot position (scroll mode), the first word of the curve data being lost from the display and the new word being added at the far right of the display. If desired, the curve may be originated in the scroll mode by sending the proper header. In such instance the first word of curve data is displayed on the right edge of the screen and is shifted left as new curve data arrives. If the MR bit is high the addressed curved is reset (erased) and the following data is started on the left side of the screen (normal or non-scrolling mode). If S2 is high, CV is high, and MR is low, curve 2 is set up in the scroll mode. To put curve 1 in the scroll mode, MR is low, CV is low, and "S1" is high. If MR is high the curve designated by CV is erased and put in the normal (non-scrolling) mode. This means that no dots are displayed and that the first curve data to follow is started on the left edge of the screen. To erase a curve and begin in the scroll mode two headers would be sent, one to erase the curve and one to set up the scrolling. If the curve is periodically updated while in the scroll mode, the S1 and S2 bit should be high in the first header. The following headers must have the S1 and S2 bits low. The curve remains in the scroll mode until a high at MR is sent.

The L1 and L2 bits are used to establish the baseline for the curve defined by the CV bit. Each curve can vertically span approximately one-half the screen, so L1 and L2 are used to designate the vertical range as shown in the following table.

TABLE II

| Vertical Range | Value of L1, L2 | | | |
|---|---|---|---|---|
| | 0,0 | 0,1 | 1,0 | 1,1 |
| High (01111110) | Line 11 Scan 1 | Line 5 Scan 4 | Line -1 Scan 0 | Line -1 Scan 0 |
| Low (00000000) | Line 23 Scan 7 | Line 17 Scan 10 | Line 11 Scan 6 | Line 11 Scan 6 |

Line-1, Scan 0 is ten scans above the top line of characters on the screen.

The C bit is used to make a curve disappear without erasing it from the memory. If C is high, the curve defined by CV is taken from the screen, but can be made to reappear simply by sending a header with a low C bit. When a blank screen command is received by the CRT, the special graphics logic acts as if it received a high C bit for both curves. This means that blanking the screen removes, but does not destroy, curve data.

The R, G, and B bits are used to define the curve color. While the D0 through D6 bits define the scan height of individual curve points. D0 is the most significant bit.

A strobe data signal SDRR is generated by control logic 17 to indicate that data has just been received 16. This strobe data signal is applied to an input of each of NAND circuit 41 AND circuit 42, and NAND circuit 43 and 44. When an invalid line address is sent, SDRR pulses with DECODE 7, D4 and D5 high, the DECODE 7 signal is applied to a second input of AND circuit 42. The signals D4 and D5 and the output of AND circuit 42 are connected to inputs of NAND circuit 45, the output of which is applied to an input of flip flop circuit 46 to produce a TREND signal 47. The TREND signal is transmitted to word decoder and data latch 18 to inhibit the character logic from interpreting special graphics curve data as normal character information. As soon as a new header message for normal character data is sent, the D1 signal will go high, causing the output of NAND circuit 43 to reset flip flop circuit 46. The D3 signal and the output of AND circuit 42 are applied to two inputs of flip flop circuit 48, thereby triggering flip flop circuit 48 according to the value of the CV bit, in word 2 (See Table I). The first output 49 of flip flop circuit 48 goes high when curve 1 is designated, while output 51 goes high when curve 2 is designated. For sake of simplicity, the position of the circuitry which is common to both curves is shown to the left and above of the dashed line, with the balance of the circuitry shown in FIG. 3 pertaining only to curve 1. The portion of the circuitry peculiar to curve 2 is identical to that shown as peculiar for curve 1.

The output 49 of flip flop circuit 48 is connected to one input of NAND circuit 44. The SDRR, TREND and DECODE 8 signals are also applied to respective inputs of NAND circuit 44. Word 3 is identified by a high on DECODE 8 when the SDRR signal arrives. If the TREND signal is high and curve 1 is addressed, NAND circuit 44 transmits a pulse to latch circuit 52 to cause the latching in the values of D4 through D8 applied to latch circuit 52 from receiver 16. Latch 52 stores the color and vertical position of the curve.

When a data word for the special graphics mode arrives, the DECODE 9 signal is high. If the TREND signal is also high, the SDRR signal causes NAND circuit 41 to transmit a pulse to flip flop circuit 53. The resulting output signal of flip flop circuit 53 is transmitted to one input of NAND circuit 54. The inverted horizontal sync signal is applied to a second input of NAND circuit 54, the output of which is applied to first and second inputs of flip flop circuit 55. An output of flip flop circuit 55, the inverted horizontal sync signal and the output 49 of flip flop circuit 48 are applied to the inputs of NAND circuit 56. The output of NAND circuit 56 is applied to one input of OR circuit 57. The output of OR circuit 57 is applied as a write enable signal to random access memory (RAM) 58. The bits D2 through D8 are applied to parallel data inputs of RAM 58. The RAM 58 also receives a write enable signal when the MR bit directs that RAM 58 be erased. When a high MR bit is received for curve 1, a pulse at the output of NAND circuit 59 produces a low for a horizontal scan time at the output of cascaded flip flop circuits 61 and 62 which is applied as an input to OR circuit 57. The entire RAM 58 is addressed once each horizontal scan time, so this fills the whole memory with highs.

The output of NAND circuit 59 is also applied to the master reset input of counter 63 to reset counter 63 to zero during the master reset cycle. The output of NAND circuit 56 is applied through inverter 64 and NOR circuit 65 to the clock input of counter 63 to cause counter 63 to count up one for each special graphics curve data point received. Thus counter 63 keeps track of the number of dots written into the curve, with the value on counter 63 being the write address for writing the corresponding special graphics curve data word into RAM 58. The DECODE 7 signal is applied to two inputs of NAND circuit 66, the output of which is applied to the parallel enable input of counter 63.

If the special graphics curve is to be put in the scroll mode, the output of AND circuit 91 goes high, causing a clock pulse on dot counter 63. At the same time the DECODE 7 signal has activated the parallel enable to dot counter 63, causing this clock pulse to set counter 63 to the value of 639 and turning the terminal count high. The logic is now in the scroll mode and new data will be put on the right side of the screen with the other data being shifted left. The parallel outputs of dot counter 63 are applied to parallel inputs of counter 67.

The DOT CLOCK signal and the horizontal sync signal are applied to inputs of counter 67, which is a modulo 640 counter which keeps track of the horizontal raster position on the screen 13. Counter 67 is clocked one value by the DOT CLOCK signal each time the raster moves one dot, there being 640 dot position on a single horizontal raster scan. The parallel outputs of counter 67 go through latch circuit 68 into the address lines on RAM 58 so that data for each point is on the output of the RAM 58 for one dot time each horizontal scan. Since the write cycles occur during horizontal sync when the dot counter 63 is parallel enabled with the binary value of the number of dots written, the RAM 58 address lines have the correct value during the write cycle. The parallel data outputs of RAM 58 are latched in latch circuit 69, the outputs of which are applied to parallel inputs of comparater circuit 71.

The 8-bit scan circuit 72 is a scan counter which counts down each horizontal sync. Scan counter 72 is parallel enabled on vertical sync to a value dependent on signals L1 and L2 (See Table I), which are latched up in latch circuit 52. The data outputs from latch 69 and scan counter 72 are compared by comparator circuit 71. When a compare occurs, the data out of RAM 58 is equal to the scan count from counter 72 and a dot must be displayed on monitor 13. This is accomplished by the output of flip flop circuit 73 being applied as one input to each of AND circuits 74-77, corresponding to RED, GREEN, BLUE and MONOCHROME. The values of R, G and B (see Table I) are held in latch circuit 52 and are applied to the second inputs of AND circuits 74, 75 and 76, respectively. This produces one dot for each piece of data in RAM 58.

On occasions the specific graphics curve input data does not contain a dot on every horizontal raster within the extent of the curve. These vertical gaps between consecutive input data points are filled in by the circuitry between comparator 71 and flip flop circuit 73. With A being the position of the input data point and B being the vertical position of the horizontal raster, the comparator 71 provides outputs responsive to $A = B$, $A > B$ and $A < B$. The $A < B$ output is applied directly to one input of AND circuit 82 and is delayed one dot position on the horizontal raster by delay circuit 81 and then applied to one input of AND circuit 83. Similarly, the $A > B$ output is applied directly to a second input of AND circuit 83 and is delayed one dot position on the horizontal raster by delay circuit 84 and then applied to a second input of AND circuit 82. The outputs of AND circuits 82 and 83 are applied to respective inputs of OR circuit 85. The $A = B$ output signal is applied to a first input of NAND circuit 86. The output of AND circuit 87 is applied to one input of each of AND circuits 82 and 83 and NAND circuit 86. The inputs to AND circuit 87 are various inhibit signals for avoiding or terminating the display of the curve dots on screen 13. The output of OR circuit 85 and the output of NAND circuit 86 are applied to respective inputs of flip flop circuit 73. If $A = B$, if $A > B$ delayed one dot equals $A < B$, or if $A < B$ delayed one dot equals $A > B$, a low is produced at the output of flip flop 73 which is gated with circuits, 74, 75, 76 and 77. The signals from AND circuits 74-77 are ORed with the corresponding signals for the other curve and applied to video drive and control circuits 26 wherein the combined signals are ORed with the character video and applied to monitor 13.

In the construction of an embodiment of the invention in accordance with FIG. 3, the following commercially available components were employed.

TABLE III

| Component | Identification |
|---|---|
| NAND 41 & 45 & 56 & 59 | Fairchild device 9LS10PC |
| AND 42 | Texas Instruments device 74LS08N |
| NAND 43 & 54, 66 | Fairchild device 9LS00 |
| NAND 44 | Texas Instruments device 74LS20N |
| FLIP FLOP 46 & 48, 53, 55, 61, 62 | Fairchild device 9LS109PC |
| LATCH 52, 68 | Texas Instrument device 74LS174N |
| OR 57 | Texas Instrument device 74LS32N |
| RAM 58 | seven Signetics M82S11 bipolar memory |
| COUNTER 63 | two Texas Instruments device 74LS161N and one Texas Instruments device 74LS160N |
| NOR 65 | Texas Instruments device 74LS02N |
| COUNTER 67 | one Texas Instruments device 74160N and two Fairchild device 9316PC |
| LATCH 69 | two Texas Instrument device 74S174N |
| COMPARATOR 71 | two Texas Instrument device 74S85N |
| SCAN 72 | two Texas Instrument device 74LS193N |
| FLIP FLOP 73 | Texas Instrument device 74LS175N |
| AND 74-77 | Fairchild device 9LS51PC |
| DELAY 81, 84 | Texas Instrument device 74LS174N |
| AND 82, 83 | Texas Instrument device 74S10N |
| OR 85 | Texas Instrument device 74LS32 |
| NAND 86 | Texas Instrument device 74S00N |
| AND 87 | Texas Instrument device 74S11N |
| AND 91 | Fairchild device 9LS11PC |

While the invention has been described in terms of presenting two curves, it is within the scope of the invention to provide for a single curve or more than two curves. Similarly, while the curve positions have been described as being in the top, middle or bottom portion of the screen, any other desired locations can be employed, including superimposition of two or more curves. Also, while the invention has been illustrated with the output of dot counter 63 being applied through position counter 67 to RAM 58 for convenience in equipment design, the output of dot counter 63 can be applied through a suitable gate to the input of RAM 58. The gate can be actuated to pass the output of dot counter 63 to RAM 58 during a raster retrace. Other reasonable variations and modifications are possible within the scope of the foregoing disclosure and the appended claims to the invention.

That which is claimed is:

1. Apparatus for producing a horizontally oriented curve on a raster type cathode ray tube display, comprising:
   a cathode ray tube;
   means for producing a raster on said cathode ray tube having horizontal scans alternating with retraces;
   means for producing a series of curve data point signals;
   a memory means;
   means for storing said series of curve data point signals in said memory means in the sequence in which they are produced;
   means for reading out of said memory means all of said series of curve data point signals in synchronization with each horizontal scan of the raster on the cathode ray tube;

means for establishing a signal representative of the vertical position of the current horizontal scan of the raster; and means for comparing the series of curve data point signals read out of said memory means during the current horizontal scan with the signal representative of the vertical position of the current horizontal scan and applying a video signal to said cathode ray tube to produce a dot on the screen of said cathode ray tube when the thus compared signals are equal.

2. Apparatus in accordance with claim 1 wherein said means for storing comprises means for writing said series of curve data points into said memory means during the retrace portions of the raster.

3. Apparatus in accordance with claim 1 further comprising means for establishing a position signal representative of the desired baseline for said curve; and means for modifying, responsive to said position signal, said signal representative of the vertical position of the current horizontal scan.

4. Apparatus in accordance with claim 3 further comprising a first comparator means for establishing a first signal when the signal read out of said memory means is greater than the signal representative of the vertical position of the current horizontal scan, and a second signal when the signal read out of said memory means is less than the signal representative of the vertical portion of the current horizontal scan; means for delaying said first signal one dot position to produce a third signal; means for delaying said second signal one dot position to produce a fourth signal; second comparator means for comparing said first and fourth signals and for comparing said second and third signals; and means for also applying said video signal to said cathode ray tube to produce a dot on the screen of said cathode ray tube when said first and fourth signals are equal, and when said second and third signals are equal.

5. Apparatus in accordance with claim 1 further comprising a first comparator means for establishing a first signal when the signal read out of said memory means is greater than the signal representative of the vertical position of the current horizontal scan, and a second signal when the signal read out of said memory means is less than the signal representative of the vertical portion of the current horizontal scan; means for delaying said first signal one dot position to produce a third signal; means for delaying said second signal one dot position to produce a fourth signal; second comparator means for comparing said first and fourth signals and for comparing said second and third signals; and means for also applying said video signal to said cathode ray tube to produce a dot on the screen of said cathode ray tube when said first and fourth signals are equal, and when said second and third signals are equal.

6. Apparatus in accordance with claim 5 wherein said means for storing comprises means for writing said series of curve data points into said memory means during the retrace portions of the raster.

7. Apparatus in accordance with claim 1 additionally comprising means for shifting said horizontally oriented curve in a horizontal direction, after the complete curve has been generated, in such a manner that the first data point on said horizontally oriented curve is lost and a new data point can then be added adjacent the last data point on said horizontally oriented curve.

8. Apparatus in accordance with claim 1 additionally comprising:

means for placing the first dot of said horizontally oriented curve at the edge of said cathode ray tube; and means for shifting said first dot towards the center of said cathode ray tube and replacing said first dot with the second dot of said horizontally oriented curve in such a manner that the leading edge of said horizontally oriented curve, represented by said first dot, advances across said cathode ray tube in a horizontal direction.

9. Apparatus in accordance with claim 4 additionally comprising means for shifting said horizontally oriented curve in a horizontal direction, after the complete curve has been generated, in such a manner that the first data point on said horizontally oriented curve is lost and a new data point can then be added adjacent the last data point on said horizontally oriented curve.

10. Apparatus in accordance with claim 4 additionally comprising:

means for placing the first dot of said horizontally oriented curve at the edge of said cathode ray tube; and means for shifting said first dot towards the center of said cathode ray tube and replacing said first dot with the second dot of said horizontally oriented curve in such a manner that the leading edge of said horizontally oriented curve, represented by said first dot, advances across said cathode ray tube in a horizontal direction.

11. Apparatus for producing a horizontally oriented curve on a raster type cathode ray tube display, comprising:

a cathode ray tube;

means for applying a horizontal raster comprising a series of vertically spaced horizontal scans alternating with a series of retraces, to the electron beam of said cathode ray tube, and for producing a horizontal sync signal corresponding to the occurrence of the retrace after each said horizontal scan;

dot counting means;

horizontal raster position counting means;

means for producing a series of curve dot data signals and for applying a data available pulse to said dot counting means responsive to the occurrence of each said curve dot data signal;

dot clock means for producing a series of clock pulses and for applying said series of clock pulses to said horizontal raster position counting means so that the value of the count on said horizontal raster position counting means is representative of the position of said electron beam on the current horizontal scan;

a random access memory means having address input and data inputs;

means for applying said series of curve dot data signals to said data inputs of said random access memory means as said series of curve dot data signals are produced;

means connecting the output of said horizontal raster position counting means to said address input of said random access memory means during each horizontal scan;

means connecting the output of said dot counting means to the address input of said random access memory means during a retrace after application of a data available pulse to said dot counting means;

scan counting means for producing a signal representative of the vertical position of the current horizontal trace;

signal comparison means connected to the output of said random access memory means and to the output of said scan counting means for producing an output signal when the signal of the output of said random access memory means equals the signal at the output of said scan counting means; and means responsive to the occurrence of said output signal from said signal comparison means to cause said cathode ray tube to display a dot.

12. Apparatus in accordance with claim 11 wherein said means connecting the output of said dot counting means to the address input of said random access memory means comprises means for reading the output of said dot counting means through said horizontal raster position counting means to the address input of said random access memory means during a retrace of said raster.

13. Apparatus in accordance with claim 11 further comprising means for establishing a position signal representative of the desired baseline for said curve; and means for modifying, responsive to said position signal, said signal representative of the vertical position of the current horizontal scan.

14. Apparatus in accordance with claim 11 further comprising first comparator means for establishing a first signal when the signal read out of said memory means is greater than the signal representative of the vertical position of the current horizontal scan, and a second signal when the signal read out of said memory means is less than the signal representative of the vertical portion of the current horizontal scan; means for delaying said first signal one dot position to produce a third signal; means for delaying said second signal one dot position to produce a fourth signal; second comparator means for comparing said first and fourth signals and for comparing said second and third signals; and means to cause said cathode ray tube to display a dot when said first and fourth signals are equal and when said second and third signals are equal.

15. Apparatus in accordance with claim 11 additionally comprising means for shifting said horizontally oriented curve in a horizontal direction, after the complete curve has been generated, in such a manner that the first data point on said horizontally oriented curve is lost and a new data point can then be added adjacent the last data point on said horizontally oriented curve.

16. Apparatus in accordance with claim 11 additionally comprising:
means for placing the first dot of said horizontally oriented curve at the edge of said cathode ray tube; and
means for shifting said first dot towards the center of said cathode ray tube and replacing said first dot with the second dot of said horizontally oriented curve in such a manner that the leading edge of said horizontally oriented curve, represented by said first dot, advances across said cathode ray tube in a horizontal direction.

17. A method for producing a horizontally oriented curve on a raster type cathode ray tube display, comprising the steps of:
producing a series of curve data point signals;
storing said series of curve data point signals in a memory in the sequence in which they are produced;
reading out of said memory all of said series of curve data point signals in synchronization with each horizontal scan of the raster on the cathode ray tube;
establishing a signal representative of the vertical position of the current horizontal scan of the raster; and
comparing the series of curve data point signals read out of said memory during the current horizontal scan with the signal representative of the vertical position of the current horizontal scan and applying a video signal to said cathode ray tube to produce a dot on the screen of said cathode ray tube when the thus compared signals are equal.

18. A method in accordance with claim 17 wherein said series of curve data points is written into said memory during the retrace portions of the raster.

19. A method in accordance with claim 17 further comprising establishing a position signal representative of the desired baseline for said curve; and modifying, responsive to said position signal, said signal representative of the vertical position of the current horizontal scan.

20. A method in accordance with claim 1 further comprising establishing a first signal when the signal read out of said memory is greater than the signal representative of the vertical position of the current horizontal scan, and a second signal when the signal read out of said memory is less than the signal representative of the vertical portion of the current horizontal scan; delaying said first signal one dot position to produce a third signal; delaying said second signal one dot position to produce a fourth signal; comparing said first and fourth signals; comparing said second and third signals; and also applying said video signal to said cathode ray tube to produce a dot on the screen of said cathode ray tube when said first and fouth signals are equal, and when said second and third signals are equal.

21. A method in accordance with claim 17 additionally comprising the step of shifting said horizontally oriented curve in a horizontal direction, after the complete curve has been generated, in such a manner that the first data point on said horizontally oriented curve is lost and a new data point can then be added adjacent the last data point on said horizontally oriented curve.

22. A method in accordance with claim 17 additionally comprising the steps of
placing the first dot of said horizontally oriented curve at the edge of said cathode ray tube; and
shifting said first dot towards the center of said cathode ray tube and replacing said first dot with the second dot of said horizontally oriented curve in such a manner that the leading edge of said horizontally oriented curve, represented by said first dot, advances across said cathode ray tube in a horizontal direction.

* * * * *